United States Patent [19]

Hikita et al.

[11] Patent Number: 4,803,449
[45] Date of Patent: Feb. 7, 1989

[54] FILTER COMBINING SURFACE ACOUSTIC WAVE RESONATORS

[75] Inventors: Mitsutaka Hikita, Hachiouji; Yoichi Saigo, Kanagawa; Kazuhito Kurosawa, Nakaminato, all of Japan

[73] Assignees: Hitachi Video Engineering, Inc., Tokyo, Japan; Hitachi, Ltd., Tokyo, Japan

[21] Appl. No.: 122,325

[22] Filed: Nov. 18, 1987

[30] Foreign Application Priority Data

Nov. 25, 1986 [JP] Japan .................................. 61-278642

[51] Int. Cl.$^4$ ......................... H03H 9/64; H03H 9/25
[52] U.S. Cl. .................................. 333/193; 310/313 R; 333/196
[58] Field of Search ............... 333/150, 155, 151, 152, 333/153, 154, 193, 194, 195, 196; 310/313 A, 313 B, 313 C, 313 D, 313 R

[56] References Cited

U.S. PATENT DOCUMENTS 3,716,809  2/1973  Reeder .................... 310/313 B X
4,166,258  8/1979  Tseng ..................... 333/195
4,577,168  3/1986  Hartmann .................. 333/196 X

FOREIGN PATENT DOCUMENTS 220511  9/1986  Japan .

OTHER PUBLICATIONS

Ishihara et al.—"Narrow Band Filters Using Surface Acoustic Wave Resonators", IEEE Ultrasonics Symposium Proceedings, IEEE Cat. #75 CHO 994-4Su, 1975; pp. 381–384.

Koyamada et al.—"Elastic Surface Wave Band Elimination Filters", Spring Meeting of Acoustical Society of Japan, 1974; pp. 531–532.

Ash—"Surface Wave Gratings Reflectors and Resonators", IEEE Microwave Symposium Proceedings, 1970; pp. 385–386.

Slobodnic, Jr. et al.—"Miniature Surface-Acoustic Wave Filters", Proceedings of the IEEE, vol. 67, No. 1, Jan. 1979; p. 129.

Primary Examiner—Marvin L. Nussbaum
Attorney, Agent, or Firm—Antonelli, Terry & Wands

[57] ABSTRACT

This invention relates to the structure of a band-pass or band-rejection filters by combining a plurality of one-port surface acoustic wave resonators whose interdigital electrode fingers are disposed on a piezoelectric substrate. The filter combining surface acoustic wave resonators of the present invention consists of a series circuit of the one-port surface acoustic wave resonators disposed on a piezoelectric substrate for transmitting elastic surface wave and a plurality of circuit elements containing capacitance elements, and one-port surface acoustic wave resonators disposed between the electrodes of the plurality of circuit elements and the common ground. This structure can accomplish a filter having a low loss, high power handling capability and high design freedom of rejection- and passing-band.

18 Claims, 6 Drawing Sheets

FILTER COMBINING SURFACE ACOUSTIC WAVE RESONATORS

BACKGROUND OF THE INVENTION

This invention relates generally to a filter combining surface acoustic wave resonators and more particularly to the structure of a band-pass or band-rejection filter comprising the combination of a plurality of one-port surface acoustic wave resonators having combtooth-like electrodes or so-called interdigital finger electrodes disposed on a piezoelectric substrate.

Surface acoustic wave filters having various structures are known. (A. J. Slobodnik, Jr., T. L. Szabo, and K. R. Laker, "Miniature Surface-acoustic-wave filter," Proc. IEEE, vol. 67, P.129, 1979). However, the heretofore known filters convert all the input electric signals as such to acoustic signals (elastic surface waves) and then convert all the signal components as such to the electric signals. Therefore, signals of the pass band having considerable high energy are naturally converted to the acoustic waves. When the filter is applied for high power application, a surface acoustic wave with large amplitude propagates through the substrate surface. When the signal energy to be transmitted through the piezoelectric substrate surface is excessively high, mechanical strength of the interdigital finger electrodes becomes a problem. In other words, the electromechanical migration of metal electrodes (interdigital finger electrodes) due to high power affects transmission characteristics of the filter significantly.

To solve this problem, the inventors of the present invention proposed previously a filter combining surface acoustic wave resonators by connecting in series a plurality of one-port surface acoustic wave resonators between the input and output of the filter and connecting a capacitor between the terminal of each resonator and a common ground (Japanese Patent Laid-Open No. 220511/1986). The prior invention (which will be hereinafter called the "previous proposal" in order to distinguish it from the invention of the present application) has the following construction.

Figure 1:
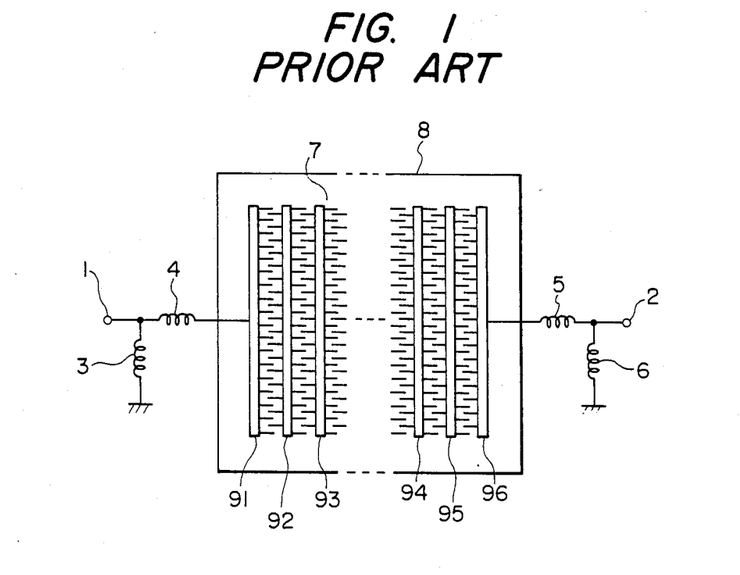
FIG. 1 is a structural view of the circuit of a conventional surface acoustic wave filter proposed previously by the inventors of the present invention.

FIG. 1 shows an example of the filter combining surface acoustic wave resonators in accordance with the previous proposal.

In the drawing, reference numeral 1 designates a signal input terminal and 2 designates an output terminal of a filter. Common electrodes 91~96 are juxtaposed on a piezoelectric substrate 8 and finger electrodes are inserted alternately and connected to the common electrodes. The common electrode 91 constitutes an input terminal and a matching circuit consisting of inductances 3 and 4 with an input load is formed between it and the signal input terminal 1. The common electrode 96 constitutes an output terminal and inductances 5 and 6 forming a matching circuit with an output load is disposed between it and the output terminal 2 of the filter. Incidentally, the surface acoustic wave filter can be expressed by an equivalent circuit diagram of FIG. 2.

Figure 2:
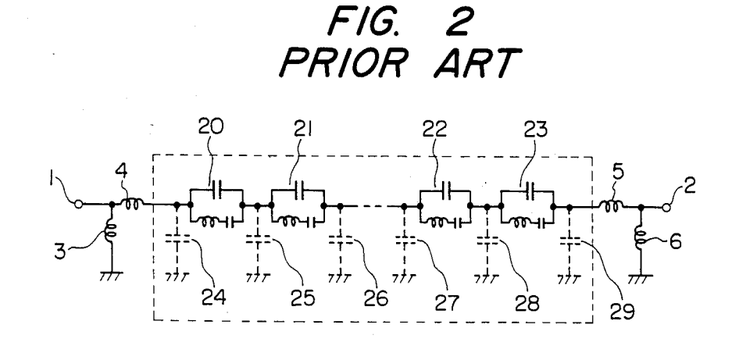
FIG. 2 is an equivalent circuit diagram of FIG. 1.

The parallel inductances 3, 6 and the series inductances 4, 5 connected to the input and output terminals 1, 2 represent external matching circuits analogous to those of FIG. 1.

Capacitances represented by the dotted line in the diagram represent the capacitances to the finger electrodes for each resonator and the electrodes connecting the resonators against the common ground or the capacitances against the common ground of the input and output terminal electrodes against the common ground. Though these capacitances are represented by dotted lines in FIG. 2, they can be set arbitrarily by increasing or decreasing the area of each electrode connecting the resonators or the area of the input and output terminal electrodes such as bonding pads. They can be set arbitrarily, too, by adjusting the thickness of the piezoelectric substrate 8. Furthermore, these capacitances may be formed by chip capacitors that are disposed outside, whenever, necessary.

Figure 3A:
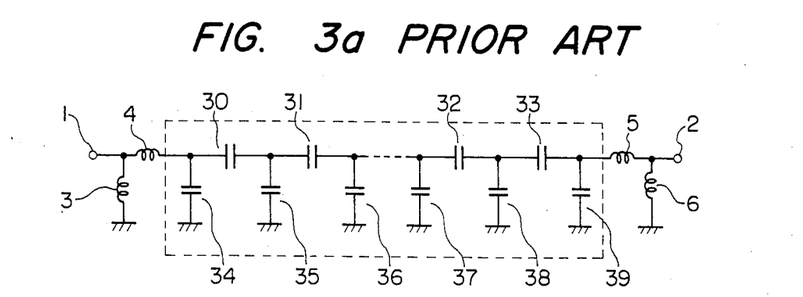
FIGS. 3a to 3d are equivalent circuit diagrams of FIG. 1 corresponding to operation frequencies, respectively.
Figure 3B:
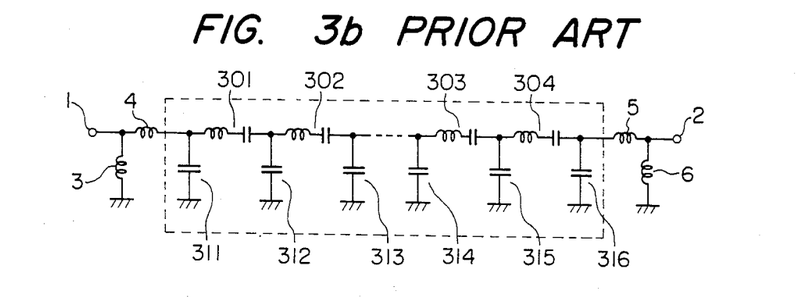
Figure 3C:
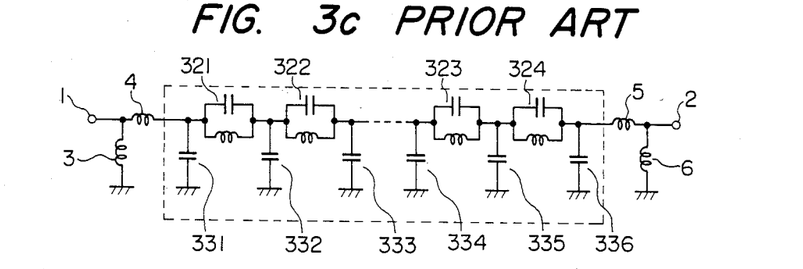

According to the circuit configuration shown in FIG. 1, the impedance of the resonator is substantially the capacitance (30~33) between the electrodes alone in a frequency nearer to the resonance frequency, as can be understood from the equivalent circuit shown in FIG. 2, and can be expressed as shown in FIG. 3a. In the proximity of a resonance point, the resonator can be expressed in the form approximate to the series connection (301~304) of inductances and capacitances due to resonance as shown in FIG. 3b. In the proximity of a anti-resonance point, on the other hand, the resonator can be expressed in the form approximate to parallel connection (321—324) of the capacitances between the electrodes of the resonator and the inductances due to resonance as shown in FIG. 3C. At a frequency sufficiently higher than the anti-resonance point, the resonator becomes again the capacitances between the electrodes alone and can be expressed as shown in FIG. 3a. Incidentally, reference numerals 34~39, 311~316 and 331~336 represent the equivalent capacitances between the electrodes of the resonators and the common ground.

Figure 3D:
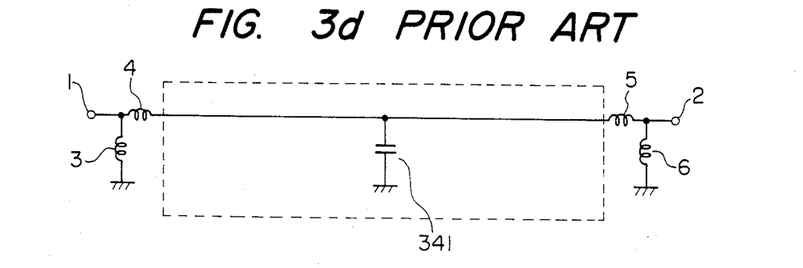

In such a circuit configuration, it is generally preferred that the pass band of the filter be set near the resonance frequency of the resonators. In this band, FIGS. 3a and 3b are simplified and can be expressed approximately as shown in FIG. 3d. In other words, since the surface acoustic wave resonators can be expressed by only the capacitance with respect to the common ground, matching with input and output loads can be attained always by external circuits.

At a frequency lower than the pass band, on the other hand, the influence of the series capacitances becomes relatively greater and the filter enters a stop band. At a frequency higher than the pass band or in other words, in the proximity of the anti-resonance frequency, the resonator can be expressed as shown in FIG. 3c and the impedance of the surface acoustic wave resonator becomes substantially high due to anti-resonance so that the filter enters the stop band. At a frequency sufficiently higher than the passing band, it can be simplified once again and expressed as shown in FIG. 3d but because the influence of the capacitance against the common ground becomes relatively large, the filter enters again the stop band.

The construction described above is suitable for a band-pass filter or band-rejection filter, for which extreme stop rise frequency characteristics are required on a higher frequency side of the pass band because the pass band is set near the resonance frequency and the stop band is set near the anti-resonance frequency.

Namely, the surface acoustic wave resonator according to the previous proposal made by the inventors of the present invention has excellent resistance to electric power and is extremely effective for accomplishing filter characteristics having a sharp rejection band on the higher frequency side of the pass band of the filter.

The inventors of the present invention examined the possibility of providing a filter having entirely opposite frequency allocation to that of the filter of the previous proposal, that is, a filter having the rejection band on the lower frequency side and the passing band on the higher frequency side, and also having sharp rise or fall characteristics.

As a result of intensive studies and production of prototypes, the inventors found out that the filter having the opposite frequency allocation as the first requisite can be implemented by delicately adjusting an external adjustment circuit inserted between the filter and the external load.

Though the filter can satisfy the first requisite, it has been found that if the second requisite, that is, the sharp rise or fall frequency characteristics, is to be attained, the loss of the passing band of the filter increases markedly and the filter has no practicality at all.

This is because the rejection band of the filter is formed by anti-resonance of each one-port surface acoustic wave filter constituting the surface acoustic wave resonator of the previous proposal. In other words, since the resonance point exists on the lower frequency side of the anti-resonance point in the one-port surface acoustic wave resonator, the loss of the filter in the pass band can be minimized by setting the pass band of the filter on the lower frequency side of the rejection band, that is, in the proximity of the resonance frequency. However, if the pass band is formed on the higher frequency side of the rejection band according to this structure as such, any contribution of resonance to the pass band can hardly be expected and the increase of loss in the pass band due to the external matching circuits (that is, by the influence of inductances in this case) cannot be neglected. This results in a serious problem particularly in those filters on which extremely severe loss characteristics are imposed, such as those filters which are used for mobile radio communication.

SUMMARY OF THE INVENTION

Accordingly, the present invention contemplates providing a filter combining surface acoustic wave resonators which eliminates the problems of the construction of the filter of the previous proposal and has high design freedom irrespective of position of the rejection band while keeping high resistance to electric power.

To accomplish the object described above, the present invention employs the fundamental construction wherein a plurality of one-port surface acoustic wave resonators and a plurality of capacitances formed on a substrate with gaps corresponding to the gaps of electrodes (or dielectric members disposed in the gaps) or series connection of combinations of both of them. Furthermore, the present invention employs the construction wherein one-port surface acoustic wave resonators similar to those described above are disposed between connection points of series connection capacitances, between connection points of later-appearing series connected one-port surface acoustic wave resonators or between connection points for the junction of the capacitances and the one-port surface acoustic wave responators and the common ground and, furthermore, between the input and output terminals of the filter itself and the common ground, whenever necessary.

Furthermore, the present invention provides a filter structure which can always establish impedance matching between the filter and the loads by connecting matching circuits with external loads to the input and output terminals of the filter in the same way as in the previous proposal.

BRIEF DESCRIPTION OF THE DRAWINGS

FIG. 6b is a frequency characteristic diagram of FIG. 6a;

DESCRIPTION OF THE PREFERRED EMBODIMENTS

In the present invention, the pass band of the filter is determined by the band obtained by the resonance frequency of the one-port acoustic wave resonators connected in series or by the resonance frequency obtained by the series connection capacitances and the matching circuit (which consists generally of an inductance circuit) connected to the input and output terminals.

However, the rejection band is determined by two values, i.e. the anti-resonance frequency of the series connection one-port surface acoustic wave resonators and the resonance frequency of each one-port surface acoustic wave resonator inserted between each junction and the common ground. Therefore, the pass band/rejection band of the filter can be set arbitrarily by setting the resonance frequency of the series connection one-port surface acoustic wave resonators and the resonance frequency of the one-port surface acoustic wave resonator inserted between each junction and the common ground to predetermined values, so that design freedom can be drastically improved in comparison with the surface acoustic wave resonator of the previous proposal.

Next, the first embodiment of the present invention will be explained.

Figure 4:
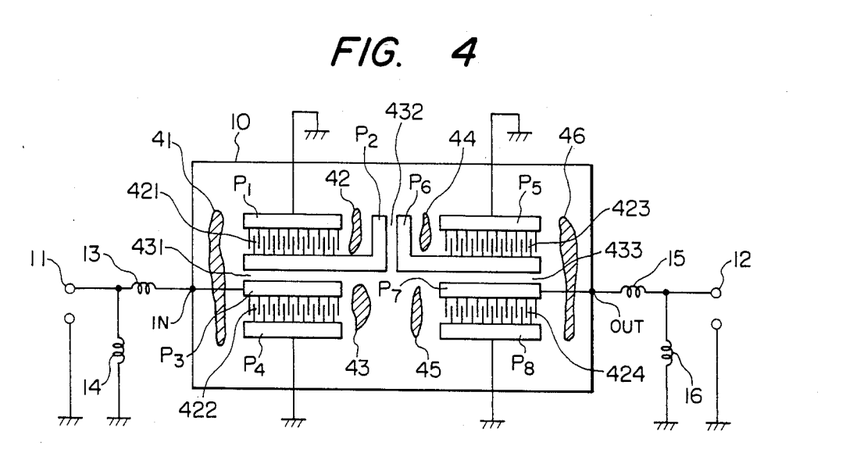
FIG. 4 is a plan view showing the construction of one embodiment of the present invention.

FIG. 4 is a plan view of the filter combining surface acoustic wave resonators in accordance with the first embodiment of the invention.

In the drawing, three capacitances 431, 432 and 433 consisting of three electrode gaps respectively which exist between the input and output terminals IN and OUT on a single piezoelectric substrate 10 and are defined by electrodes $P_2$ and $P_3$, electrodes $P_2$ and $P_6$ and electrodes $P_6$ and $P_7$, are connected in series, and these electrodes $P_2$, $P_3$, $P_6$ and $P_7$ serve as the common electrode and constitute together with electrodes $P_1$, $P_4$, $P_5$ and $P_8$ one-port surface acoustic wave resonators 421, 422, 423 and 424, respectively. These resonators 421–424 are in turn connected between the electrodes of the capacitances 431, 432, 433 and the common ground. Coils 13, 14, and 15, 16 constituting first and second external matching circuits are inserted between the terminal IN of the substrate 10 and a signal input terminal 11 and between the output terminal OUT and a signal output terminal 12, respectively. Reference numerals 41 through 46 with hatching on the substrate 10 represent absorbing materials which need not exist in practice but are used particularly when any problem develops due to reflection by the surface wave.

Figure 5A:
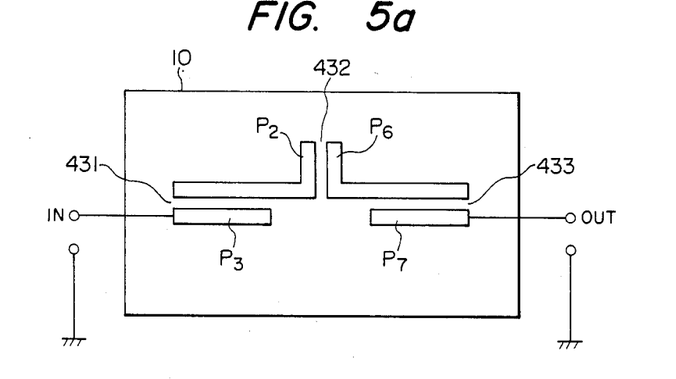
FIGS. 5a to 5d are exploded views showing the construction of each portion of FIG. 4, respectively.
Figure 5B:
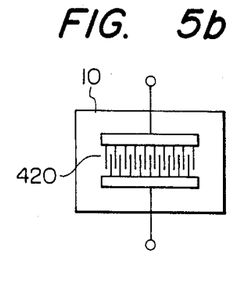
Figure 5C:
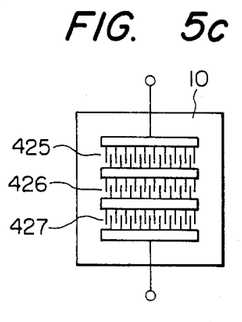
Figure 5D:
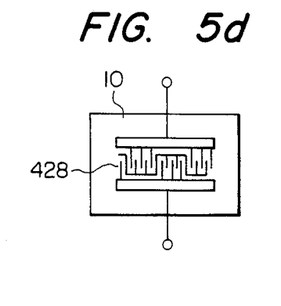

The filter described above comprises the combination of the series circuit of capacitances shown in FIG. 5a and the one-port surface acoustic wave resonators shown in FIG. 5b. These resonators may be those which are shown in FIGS. 5c and 5d, respectively.

FIG. 5b shows an example of a mere multi-electrode finger pair transducer. Though reflectors do not exist on both sides, a resonator is constituted because vibration energy is confined by internal reflection of the finger electrodes of the transducer itself. FIG. 5c shows an example where a plurality of transducers of FIG. 5b (three transducers 425, 426 and 427 in this case) are electrically connected in series, while FIG. 5d shows an example where a single transducer is divided into a plurality of units, which are electrically connected in series.

Fundamental constructions related with above one-port surface acoustic wave resonators were studied and reported in an article by e.g. F. Ishihara, Y. Koyamada and S. Yoshikawa, entitled "Narrow band filters using surface acoustic wave resonators", In IEEE Ultrasonics Symp. Proc., 1975, pp. 381–394. Y. Koyamada and F. Ishihara, "Elastic surface wave band elimination filters", reported by 1974 Spring meeting of Acoustical Society of Japan, 1974, pp. 531–532; E. A. Ash, "Surface wave grating reflectors and resonators," in IEEE Microwave Symp. Proc., 1970, pp. 385–386; and U.S. Pat. No. 3,716,809 Reeder et al. "Acoustic surface wave resonator".

When a high frequency voltage is applied to the input terminal IN of FIG. 5a, a voltage appears at the output terminal OUT through the three gap capacitances. However, since the capacitance value of the gap capacitance is set generally to an extremely small value, the level of the output terminal voltage is extremely small. Therefore, the single structure shown in FIG. 5a does not have any filter function. If a simple matching circuit (e.g. coils 13, 14, 15, 16) is introduced outside as shown in FIG. 4, the gap capacitance value can be cancelled by the inductance of the coil at an arbitrary resonance frequency. Therefore, a band-pass filter having an arbitrary frequency as its pass band can be constituted by setting the capacitance value and the construction of the matching circuit to predetermined values.

However, such a filter remains a mere LC filter, in principle, and is not free from the following problem. Namely, if a relatively narrow band low loss filter having a band-width of about 3 to 4% is to be attained such as a filter required for mobile radio, for example, a sufficient large Q value cannot be obtained from a mere LC circuit so that the loss in the passing band increases. In addition, the sharp frequency characteristics required in the mobile radio, for example, cannot be accomplished.

Figure 6A:
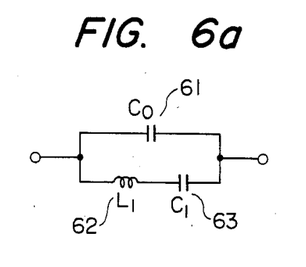
FIG. 6a is an equivalent circuit diagram of a one-port surface acoustic wave resonator.

The electrical equivalent circuit of the one-port surface acoustic wave resonators shown in FIGS. 5b, 5c and 5d can be approximated to the circuit shown in FIG. 6a. In other words, it can be approximately expressed as a parallel circuit of the electrostatic capacitance 61 ($C_0$) between the finger electrodes and a series circuit of the equivalent inductance 62 ($L_1$) and capacitance ($C_1$) resulting from resonance of elastic vibration.

Figure 6B:
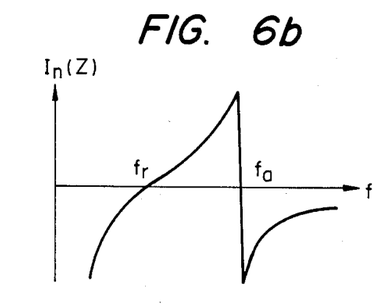

As shown in FIG. 6b, the frequency characteristics of the impedance across both terminals of the resonator become In $(Z) \simeq 0$ at the resonance frequency and In $(Z) \simeq \infty$ at the anti-resonance frequency. Here, In represents the imaginary part of the impedance.

Figure 7:
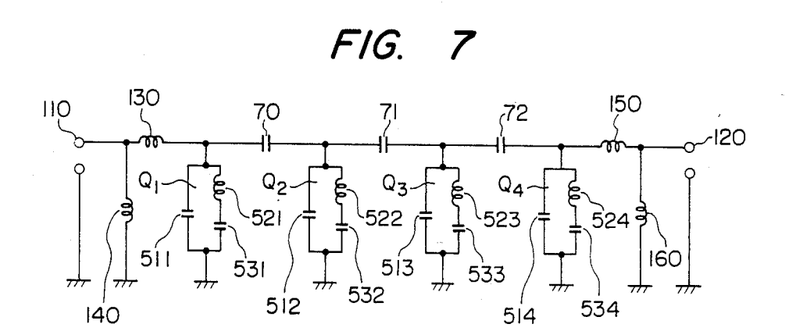
FIG. 7 is an equivalent circuit diagram of the filter shown in FIG. 4.

The filter shown in FIG. 4 can be expressed approximately by the equivalent circuit of FIG. 7 by use of the equivalent circuit shown in FIG. 6a. As can be understood from the equivalent circuit of FIG. 7, the pass band of the filter is determined by the matching condition between the three series connection capacitances 70, 71, 72 and the matching circuits (e.g. coils 130, 140, 150, 160) introduced to the input and output terminals. Since the LC circuit without the surface acoustic wave resonators provides only low Q as described already, however, the loss of the pass band cannot be reduced generally unless matching is attained over an extremely broad band. Therefore, the frequency characteristics of the filter formed by the series connection capacitances and the external matching circuits are devoid of sharpness but extend over an extremely broad band. However, the one-port surface acoustic wave resonator circuits ($Q_1$ consisting of 511-521-531, $Q_2$ consisting of 512-522-532, $Q_3$ consisting of 513-523-533 and $Q_4$ consisting of 514-524-534) connected between the connection points of the series connected capacitances, 70, 71, 72, and between the connection points for the junction of the capacitances and the coils 130, 150 and the common ground solve the problem described above. This is particularly advantageous for obtaining a filter having a sharp rejection band on the lower frequency side of the pass band.

Figure 8:
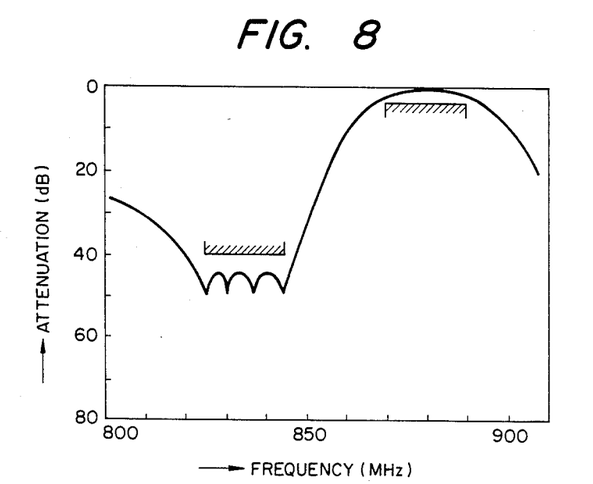
FIG. 8 is a frequency characteristic diagram of FIG. 7.

Hereinafter, the embodiment will be explained in further detail by use of the result of a calculation of definite numeric values. FIG. 8 shows a design example of a mobile radio reception filter having the specification set as follows. Namely, let's assume the case where sharp frequency characteristics having a pass band of 870 to 890 MHz and a rejection band of 825 to 845 MHz are required. If only the series connection capacitances 70, 71, 72 and the external matching circuits 130, 140, 150, 160 shown in FIG. 7 are employed, attenuation of only about 5 to 10 dB in the rejection band of 825 to 845 MHz can be obtained for such a requirement. Therefore, if the resonance frequencies of the resonators $Q_1$–$Q_4$ connected to the ground as shown in FIG. 7 are set within the range of the rejection band 825 to 845 MHz of the filter, the impedance across both terminals of the resonators becomes substantially zero, that is, In $(Z) \simeq 0$, within the resonance frequencies (825–845 MHz). Therefore, large attenuation can be obtained. The frequency characteristics shown in FIG. 8 represent one example for designed filters wherein a broad band width is achieved by somewhat deviating mutually the resonance frequencies of the one-port surface acoustic wave resonators used in the filter shown in FIG. 4 which are expressed by the equivalent circuit diagram of FIG. 7.

If the resonance frequencies of a plurality of one-port surface acoustic wave resonators are deviated from one another as described above, the band width of the filter can be set to an arbitrary band.

In the pass band of the filter described above, the impedance of each resonator becomes substantially high, that is, In $(Z) \simeq \infty$, because the frequency is near the anti-resonance frequency of each resonator. Therefore, hardly any influences are exerted on the pass band by the introduction of the resonators.

The design example of FIG. 8 uses the following parameters. The piezoelectric substrate is 36° YX - LiTaO$_3$, the gap capacitance is 2 pF, the aperture length of the one-port surface acoustic wave resonator is 4 wavelengths, the number of finger pairs is 400 pairs and the resonator type shown in FIG. 5$b$ is used.

In FIG. 8, the loss of the pass band is 2 dB and attenuation of at least 40 dB can be obtained in the rejection band. As described above, the present invention provides the filter combining the surface acoustic wave resonators wherein the gap capacitances formed on the single substrate 1 are connected in series, the one-port surface acoustic wave resonators are introduced between the series connection points and the common ground and between the input and output terminals and the common ground and the matching circuits with the external load are disposed at the input and output terminals.

Figure 9:
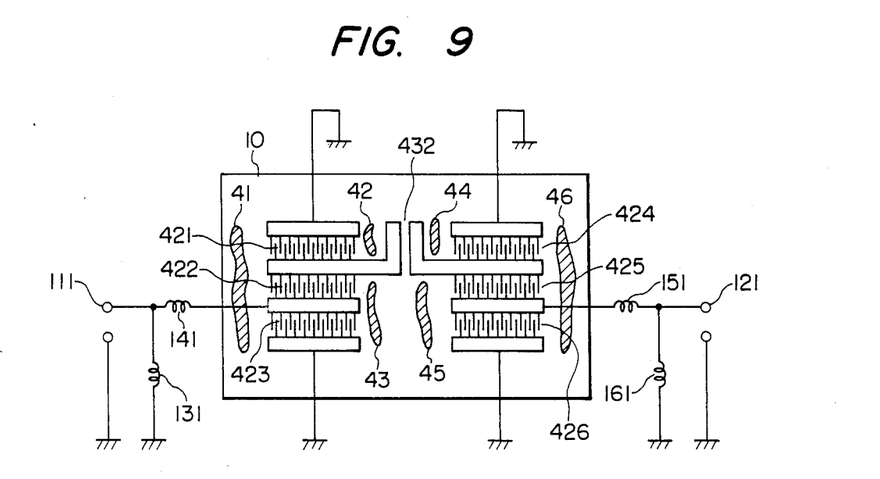
FIG. 9 is a plan view showing the construction of the filter in accordance with another embodiment of the present invention.
Figure 10:
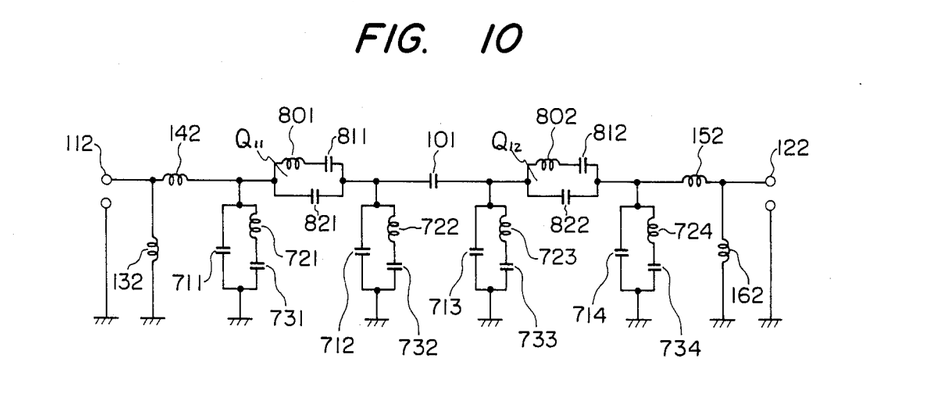
FIG. 10 is an equivalent circuit diagram of FIG. 9.
Figure 11:
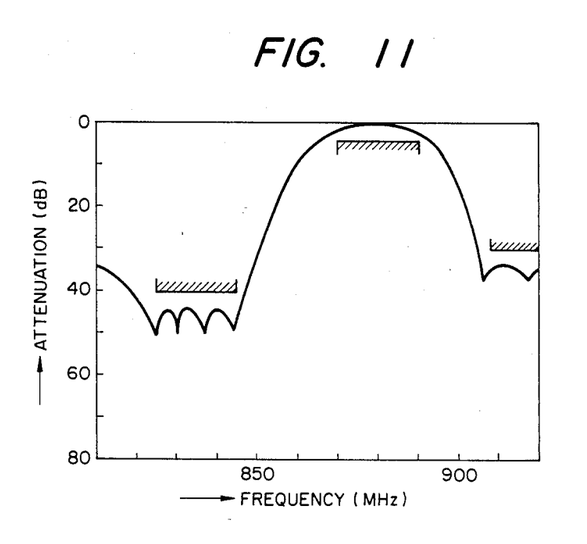
FIG. 11 is a frequency characteristic diagram of FIG. 10.

In the embodiment shown in FIG. 4, the gap capacitances formed on the single substrate 10 are connected in series, but the one-port surface acoustic wave resonators or both the gap capacitances and the one-port surface acoustic wave resonators may be connected in series besides the gap capacitances. In the embodiment shown in FIG. 9, two one-port surface acoustic wave resonators and one gap capacitance are connected in series, and the one-port surface acoustic wave resonators are introduced between the series connection points and the common ground and between the input and output terminals and the common ground, in the same way as in the embodiment shown in FIG. 5. As can be seen from its approximate equivalent circuit shown in FIG. 10, such a circuit construction can form the rejection band of the filter also in the proximity of the anti-resonant frequencies of the one-port surface acoustic wave resonators connected in series (that is, on the higher band side of the passing band). Accordingly, a filter having sharp rise and fall frequency characteristics for rejection bands on both lower and higher frequency sides of the pass band can be accomplished in cooperation with a capacitance element 101 as can be seen from FIG. 11 which shows its frequency characteristics.

The present invention can accomplish a surface acoustic wave resonator filter having a low loss but having high power handling capability and sharp frequency characteristics for rejection band on the lower frequency side of the passing band in the same way as the filter of the previous proposal (Japanese Patent Laid-Open No. 22051/1986).

What is claimed is:

1. A filter combining surface acoustic wave resonators comprising:
    a piezoelectric substrate;
    a plurality of resonators disposed on said piezoelectric substrate so as to comprise a series circuit formed by connecting in series a plurality of circuit elements each including a capacitance element having a corresponding pair of electrodes, and wherein individual resonators in the form of one-port surface acoustic wave resonators are respectively coupled between an electrode of each said circuit element and a common ground;
    a first external matching circuit inserted between a signal input terminal and said resonator; and
    a second external matching circuit inserted between a signal output terminal and said resonator.

2. A filter combining surface acoustic wave resonators according to claim 1, wherein said series circuit is formed by connecting in series only a plurality of capacitance elements.

3. A filter combining surface acoustic wave resonators according to claim 1, characterized in that said series circuit is formed by connecting in series a capacitance element and a one-port surface acoustic wave resonator.

4. A filter combining surface acoustic wave resonator according to any one of claims 1 through 3, wherein a plurality of said one-port surface acoustic wave resonators are connected between an electrode of one or more circuit element and said common ground, and wherein at least one of said one-port surface acoustic wave resonators has a resonance frequency different from that of the others.

5. A filter combining surface acoustic wave resonators according to claim 3, wherein said electrodes comprise common electrodes of said one-port surface acoustic wave resonators and wherein said capacitance elements comprise gap regions formed between common electrodes of respective one-port surface acoustic wave resonators.

6. A filter combining surface acoustic wave resonators according to claim 5, wherein each of said one-port surface acoustic wave resonators including at least one electrode coupled to said common ground.

7. A filter combining surface acoustic wave resonators according to claim 6, wherein each of said surface acoustic wave resonators includes interdigital electrode fingers disposed on said piezoelectric substrate and protruding from each respective electrode therein in a comb-like manner in a direction toward another electrode of the same surface acoustic wave resonator.

8. A filter combining surface acoustic wave resonators according to claim 1, wherein each capacitance element of said plurality of circuit elements is formed by a gap disposed between common electrodes of respective one-port surface acoustic wave resonators.

9. A filter combining surface acoustic wave resonators according to claim 8, wherein said plurality of resonators comprises a plurality of one-port surface acoustic wave resonators coupled between said first and second external matching circuits, each having a pair of electrodes, one electrode being coupled to common ground and the other positionally disposed so as to effect in a predetermined capacitance gap with a corresponding electrode of another one of said one-port surface acoustic wave resonators, wherein said surface acoustic wave resonators are disposed such that a plurality of series coupled capacitance gaps are formed between said first and second external matching circuits, and wherein said first and second external matching circuits are coupled to a non-grounded electrode of respective one-port surface acoustic wave resonators.

10. A filter combining surface acoustic wave resonators according to claim 9, wherein said plurality of one-port surface acoustic wave resonators consist of four one-port surface acoustic wave resonators, each having a pair of electrodes, one being coupled to a common ground and the other forming an electrode of said capacitance element.

11. A filter combining surface acoustic wave resonators according to claim 10, wherein each of said surface acoustic wave resonators forms a frequency filter corresponding to a capacitance in parallel with a series connection of another capacitance and an inductance between an electrode of said capacitance element and said common ground.

12. A filter combining surface acoustic wave resonators according to claim 11, wherein each of said surface acoustic wave resonators includes interdigital electrode fingers disposed on said piezoelectric substrate and protruding from each respective electrode therein in a comb-like manner in a direction toward another electrode of the same surface acoustic wave resonator.

13. A filter combining surface acoustic wave resonators according to claim 1, wherein each said capacitance element of said plurality of circuit elements is comprised from a respective gap between common electrodes of serially disposed one-port surface acoustic wave resonators, each said resonator having at least one other electrode coupled to a common ground.

14. A filter combining surface acoustic wave resonators according to claim 13, wherein each said resonator has two other electrodes coupled to a common ground.

15. A filter combining surface acoustic wave resonators according to claim 14, wherein said plurality of resonators is comprised of a pair of one-port surface acoustic wave resonators each one structured as a plurality of series connected transducers, each resonator having a pair of grounded electrodes disposed at opposite ends of the resonator, an intermediate electrode coupled to a respective one of said external matching circuits and a second intermediate electrode positionally disposed so as to effect a capacitance coupling with the corresponding second intermediate electrode of the other one of said pair of resonators.

16. A filter combining surface acoustic wave resonators according to claim 15, wherein said plurality of circuit elements comprises a capacitor formed by a gap between said second intermediate electrodes and a pair of parallel circuits each including an arrangement of a capacitance in parallel with a series arrangement of a capacitor and an inductor, wherein each parallel circuit represents the resonating filter resulting between the respective intermediate electrodes in each of said pair of one-port surface acoustic wave resonators.

17. A filter combining surface acoustic wave resonators according to claim 16, wherein the coupling of said individual one-port surface acoustic wave resonators between an electrode and a common ground corresponds to a transducer resonating filter formed by resonating a frequency between an intermediate electrode and a grounding electrode in each of said pair of one-port surface acoustic wave resonators.

18. A filter combining surface acoustic wave resonators according 12, wherein each of said surface acoustic wave resonators includes interdigital electrode fingers disposed on said piezoelectric substrate and protruding from each respective electrode therein in a comb-like manner in a direction toward another electrode of the same surface acoustic wave resonator.

* * * * *